(12) United States Patent
Kim

(10) Patent No.: US 10,674,592 B2
(45) Date of Patent: Jun. 2, 2020

(54) PLASMA GENERATION APPARATUS

(71) Applicant: ELECTRONICS AND TELECOMMUNICATIONS RESEARCH INSTITUTE, Daejeon (KR)

(72) Inventor: Yark Yeon Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/584,575

(22) Filed: Sep. 26, 2019

(65) Prior Publication Data

US 2020/0107430 A1    Apr. 2, 2020

(30) Foreign Application Priority Data

Sep. 27, 2018  (KR) .................. 10-2018-0115299
Aug. 6, 2019   (KR) .................. 10-2019-0095305

(51) Int. Cl.
| | |
|---|---|
| H01J 7/24 | (2006.01) |
| H05H 1/24 | (2006.01) |
| H01J 37/32 | (2006.01) |
| H01J 37/34 | (2006.01) |
| H05H 1/46 | (2006.01) |

(52) U.S. Cl.
CPC ..... *H05H 1/2406* (2013.01); *H01J 37/32009* (2013.01); *H01J 37/3494* (2013.01); *H01J 37/32532* (2013.01); *H01J 37/32623* (2013.01); *H05H 1/24* (2013.01); *H05H 1/46* (2013.01); *H05H 2001/2462* (2013.01); *H05H 2001/2468* (2013.01)

(58) Field of Classification Search
CPC .......... H01J 37/32009; H01J 37/32532; H01J 37/32623; H05H 1/00; H05H 1/24; H05H 1/46
See application file for complete search history.

(56) References Cited

U.S. PATENT DOCUMENTS

| | | | |
|---|---|---|---|
| 2003/0222586 A1* | 12/2003 | Brooks | H01J 37/32009 315/111.71 |
| 2015/0273231 A1 | 10/2015 | Kim et al. | |
| 2017/0049913 A1 | 2/2017 | Yu et al. | |

OTHER PUBLICATIONS

Mounir Laroussi, "Plasma Medicine: A Brief Introduction", Plasma, Feb. 19, 2018, vol. 1, pp. 47-60, MDPI.

Xuechen Li et al., "A brush-shaped air plasma jet operated in glow discharge mode at atmospheric pressure," Journal of Applied Physics, Sep. 11, 2014, pp. 023302-1-023302-6, vol. 116, AIP Publishing LLC.

Stephan Rueter et al., "The kINPen—a review on physics and chemistry of the atmospheric pressure plasma jet and its applications", Journal of Physics D: Applied Physics, 2018, vol. 51 23301, pp. 1-51, IOP Publishing Ltd, UK.

* cited by examiner

*Primary Examiner* — Thuy V Tran

(57) ABSTRACT

Provided is a plasma generation apparatus including: a housing in which a window is defined at one side in a first direction; a stick type plasma source provided in the housing to generate plasma toward the window; and a driving unit coupled to the plasma source to allow one end of the plasma source to perform a reciprocating movement in a second direction that is a longitudinal direction of the window.

10 Claims, 9 Drawing Sheets

PLASMA GENERATION APPARATUS

CROSS-REFERENCE TO RELATED APPLICATIONS

This U.S. non-provisional patent application claims priority under 35 U.S.C. § 119 of Korean Patent Application Nos. 10-2018-0115299, filed on Sep. 27, 2018 and 10-2019-0095305, filed on Aug. 6, 2019, the entire contents of which are hereby incorporated by reference.

BACKGROUND

The present disclosure herein relates to a plasma generation apparatus.

Plasma has been researched to be applied to a bio-medical field. Particularly, the plasma is effective for skin tissue regeneration by means of skin cell activation and all sorts of sterilization. In case of treatments using atmospheric-pressure plasma, effective results for hemostasis, blood coagulation, sterilization and disinfection, and cell regeneration have been reported.

Typical researches and developments of a plasma generation apparatus are classified into a direct plasma type and an indirect plasma type. A direct plasma type plasma system uses a target to be treated or cured as a ground electrode. Although the direct plasma type has high treatment effects, the direct plasma type has a disadvantage in that the target to be irradiated (treated) almost contacts a power electrode, and the plasma has low uniformity according to electrical characteristics of the target to be treated. An indirect plasma type plasma system generates a plasma plume at a high voltage electrode and a ground electrode in a plasma generation apparatus to spray the plasma plume to an area to be treated. The indirect plasma type has treatment effects less than that of the direct plasma type, and is hardly realized for a large area.

SUMMARY

The present disclosure provides a plasma generation apparatus capable of uniformly generating a large-area low-temperature plasma.

The object of the present disclosure is not limited to the aforesaid, but other objects not described herein will be clearly understood by those skilled in the art from descriptions below.

An embodiment of the inventive concept provides a plasma generation apparatus including: a housing in which a window is defined at one side in a first direction; a stick type plasma source provided in the housing to generate a plasma toward the window; and a driving unit coupled to the plasma source to allow one end of the plasma source to perform a reciprocating movement in a second direction that is a longitudinal direction of the window.

In an embodiment, the plasma source may have a structure including one plasma jet or an array structure including a plurality of plasma jets.

In an embodiment, the driving unit may include: a coupling unit configured to couple other end of the plasma source to the inside of the housing; and a power transmission unit spaced apart from the coupling unit to transmit a power to the plasma source.

In an embodiment, the power transmission unit may include: a power gear having a partial gear and a frame that is engaged with an upper gear and a lower gear in a repeated manner by rotation of the power gear.

In an embodiment, the power transmission unit may include a motor spaced by a predetermined distance from the plasma source and a shaft configured to convert a rotation movement of the motor into a vibration movement to transmit the converted vibration movement to the plasma source.

In an embodiment, the coupling unit may couple an axis of rotation of the plasma source to the inside of the housing. The plasma source may perform a pendulum movement by the driving unit. The one end of the plasma source may emit the plasma toward the window.

In an embodiment, the coupling unit may couple the plasma source to the inside of the housing so that the plasma source moves in the second direction. The plasma source may perform a linear reciprocating movement in the second direction by the driving unit. The one end of the plasma source may emit the plasma toward the window.

In an embodiment, the plasma source may include: a tube which extends in the first direction and in which the plasma source is provided; and an electrode disposed adjacent to the one end of the plasma source on an outer circumferential surface of the tube.

In an embodiment, the electrode may include a ring electrode or a spiral coil electrode, which surrounds the tube.

In an embodiment, the window may be a variable window in which a width of an opening is adjusted in the second direction, and a size of the plasma plume may be adjusted according to the width of the opening.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
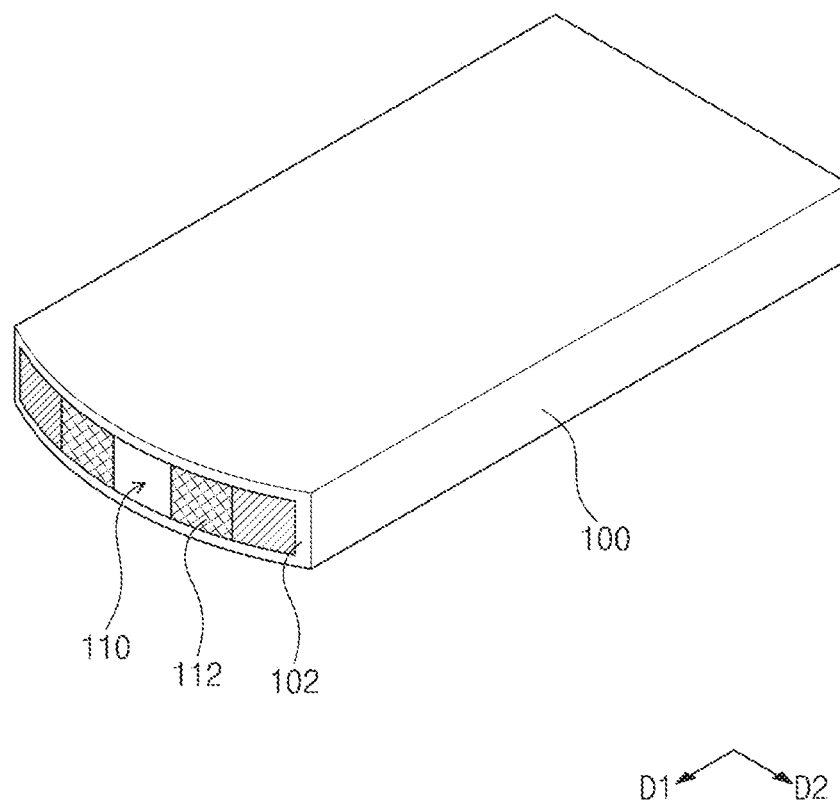
FIG. 1 is a perspective view for explaining a plasma generation apparatus according to embodiments of the inventive concept.

Exemplary embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. A person with ordinary skill in the technical field of the present invention pertains will be understood that the present invention can be carried out under any appropriate environments.

In the following description, the technical terms are used only for explaining a specific exemplary embodiment while not limiting the present disclosure. The terms of a singular form may include plural forms unless referred to the contrary. The meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers (or films) in various embodiments of the present invention, the regions and the layers are not limited to these terms. These terms are used only to discriminate one region or layer (or film) from another region or layer (or film). Therefore, a layer referred to as a first layer in one embodiment can be referred to as a second layer in another embodiment. An embodiment described and exemplified herein includes a complementary embodiment thereof. In every possible case, like reference numerals are used for referring to the same or similar elements in the description and drawings.

Unless terms used in embodiments of the present invention are differently defined, the terms may be construed as meanings that are commonly known to a person skilled in the art.

Figure 2:
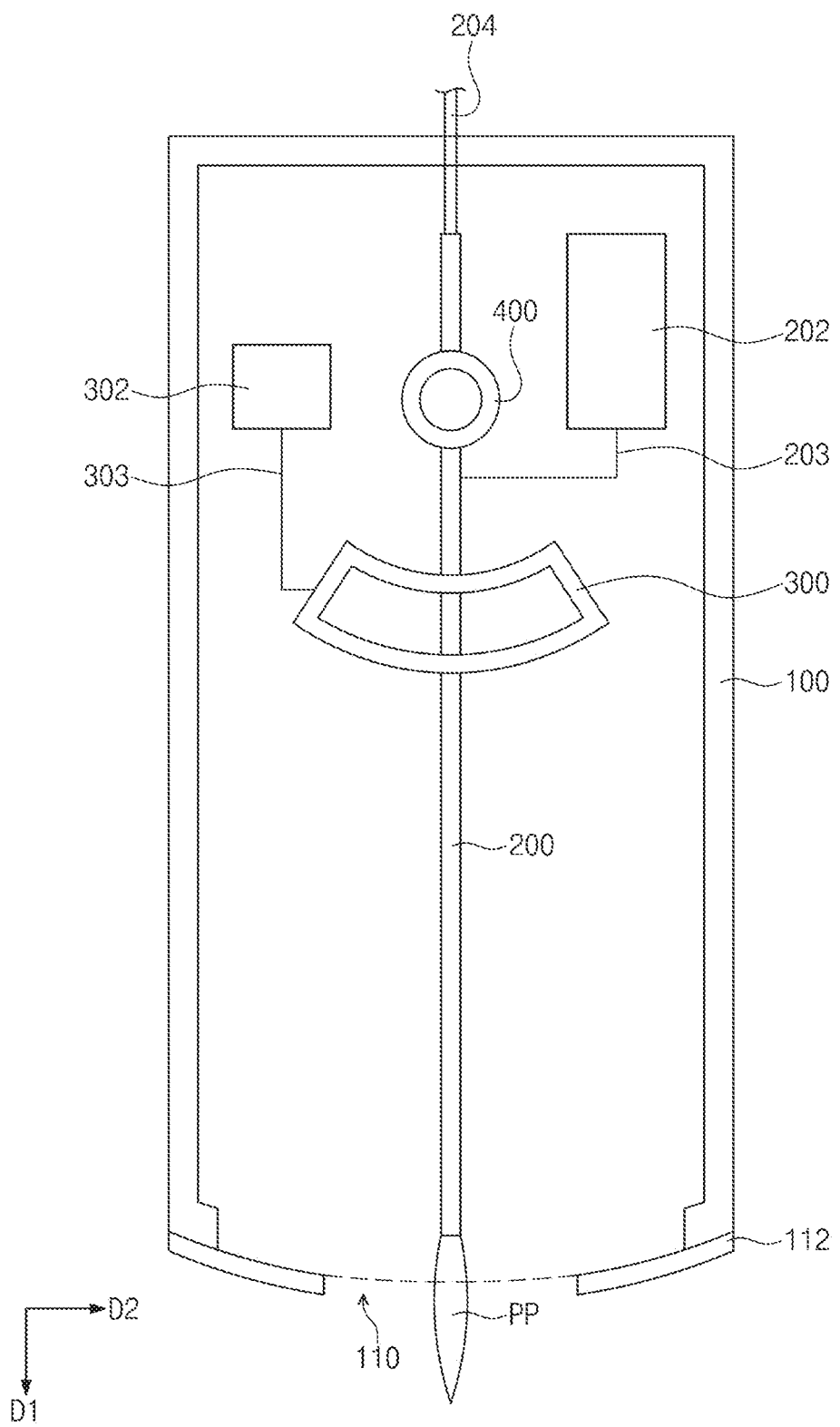
FIG. 2 is a cross-sectional view for explaining the plasma generation apparatus according to the embodiments of the inventive concept.
Figure 3:
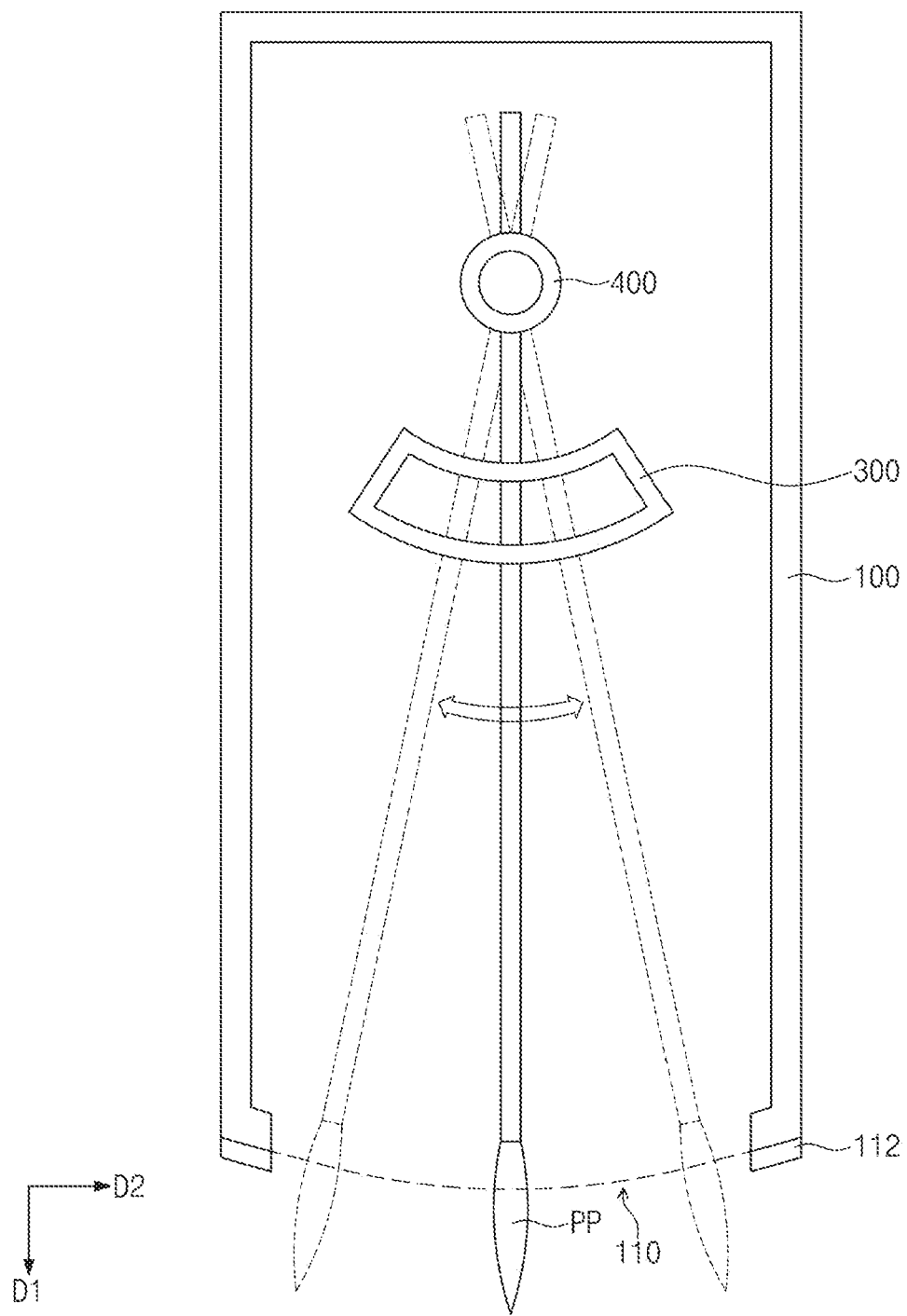
FIG. 3 is a cross-sectional view for explaining an operation of the plasma generation apparatus according to the embodiments of the inventive concept.

Hereinafter, a plasma generation apparatus according to an embodiment of the inventive concept will be described with reference to the accompanying drawings. FIG. 1 is a perspective view for explaining a plasma generation apparatus according to embodiments of the inventive concept. FIG. 2 is a cross-sectional view for explaining the plasma generation apparatus according to embodiments of the inventive concept. FIG. 3 is a cross-sectional view for explaining an operation of the plasma generation apparatus according to embodiments of the inventive concept.

Referring to FIGS. 1 and 2, the plasma generation apparatus may include a housing 100 and a plasma source 200 disposed in the housing 100.

The housing 100 may be provided. The housing may have an extremely great length in comparison with a width and a height thereof. Here, a first direction D1 and a second direction D2 may be perpendicular to a longitudinal direction of the housing 100. The first direction D1 may correspond to the longitudinal direction of the housing 100, and the second direction D2 may correspond to a width direction of the housing 100. The housing 100 may have an empty inside. The housing 100 may include an insulating material and an electromagnetic shielding material. For example, the electromagnetic shielding material may include a conductor.

The housing 100 may include a window 110 at one end thereof in the first direction D1 to discharge a plasma plume PP provided from the plasma source 200 to the outside. Here, the window 110 may be a variable window. This will be described in detail later. The window of the housing 100 may have an opening shape so that the inside and the outside of the housing 100 communicate with each other. For example, one surface 102 of the housing 100 in the first direction D1 may be opened, and a screen 112 defining the window 110 may be provided on the one surface 102 of the housing 100 in the first direction D1. Here, the window 110 may have a planar or curved shape extending in the second direction D2.

The plasma source 200 may be disposed in the housing 100. The plasma source 200 may include a stick-type plasma source. For example, the plasma source 200 may have an overall shape of a rectangle or a circular cylinder. One end of the plasma source 200 in the first direction D1 may provide and emit the plasma plume PP. Here, the one end of the plasma source 200, from which the plasma plume PP is emitted, may be spaced 1 mm to 10 mm from the window 110, and the plasma plume PP provided from the plasma source 200 may be emitted by a distance of about 1 cm to about 10 cm from the window 110 to the outside. The plasma plume PP may be emitted from the one end of the plasma source 200 with a ship shape or an oval shape. Here, a direction in which the plasma plume PP is emitted may be parallel to a direction in which the plasma source 200 extends.

The plasma plume PP provided from the plasma source 200 may be emitted to the outside of the housing 100 through the window 110 of the housing 100.

The plasma source 200 may be coupled to the housing 100 so as to move in the housing 100. For example, as illustrated in FIG. 3, the plasma source 200 may be installed to perform a pendulum movement in the housing 100. Here, a movement direction of the one end of the plasma source 200 may be repeated in the second direction D2 and an opposite direction of the second direction D2. Here, the second direction D2 may correspond to a direction in which the window 110 of the housing 100 extends. As the plasma source 200 performs a pendulum movement, the plasma plume PP provided and emitted from the plasma source 200 also may be repeated in the second direction D2. When the pendulum movement of the plasma source 200 increases in speed, the plasma plume PP may exhibit substantially the same effect as the plasma plume having a wide width in the second direction D2. That is, the plasma generation apparatus according to an embodiment of the inventive concept may provide the plasma plume having a wide width by using a simple structure. A coupling relationship between the plasma source 200 and the housing 100 will be described later in detail in conjunction with driving unit 300 and 400.

In general, the plasma generation apparatus uses discharge caused by a high voltage. In this case, as an intensity of the discharge voltage increases, a temperature of the plasma plume may increase. When the above-described plasma plume is continuously irradiated to a target (e.g., human skin), a risk of skin damage due to a high temperature may exist, and a risk of electric shock due to a high voltage may exist.

According to an embodiment of the inventive concept, the plasma source may scan the target through a reciprocating movement with a high speed on a predetermined area of the target. Thus, the plasma generation apparatus may provide a large-area plasma plume and increase a uniformity of the provided plasma plume. Also, since the plasma source does not continuously provide the plasma plume at one area, excessive thermal energy may not be transferred to the target, and stability in temperature of the plasma generation apparatus may improve. Furthermore, a risk of electric shock may be relieved.

Hereinafter, a constitution of the plasma source 200 will be described. FIGS. 4A to 4G are cross-sectional views for explaining the plasma source.

Figure 4A:
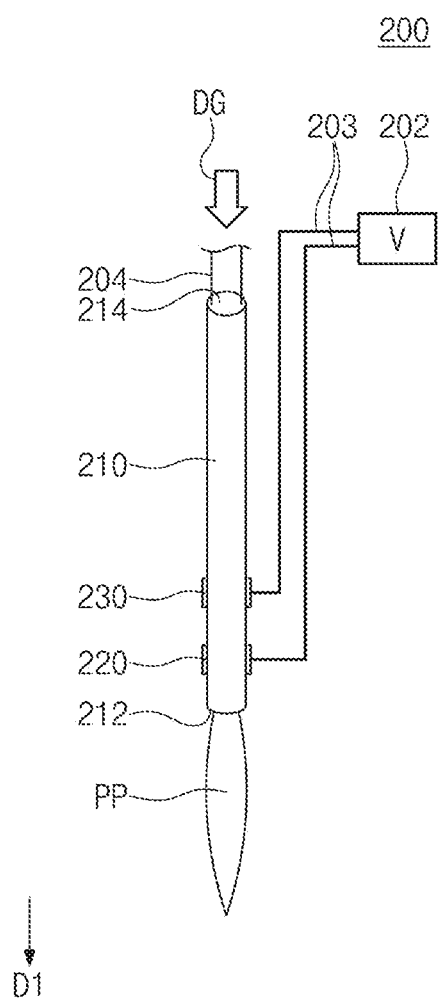
FIGS. 4A to 4G are cross-sectional views for explaining a plasma source.

Referring to FIG. 4A, the plasma source 200 may include a plasma jet type plasma source. For example, the plasma source 200 may include a tube 210 and at least one electrode 220 and 230.

The tube 210 may have a cylindrical shape having a large ratio between a vertical length and a transverse diameter. The tube 210 may provide the plasma plume PP by applying a high voltage generated from the electrode 220 and 230 to a discharge gas supplied through the tube. In the tube 210, a first end 212 in the first direction D1 may be opened to emit the provided plasma plume PP to the first end 212 of the tube 210 in the first direction D1. The tube 210 may include an insulating material. A discharge gas DG may be injected into the tube 210. The discharge gas DG may be injected to a second end 214, which is disposed at an opposite direction of the first direction D1 of the tube 210, and move to the first end 212. The discharge gas DG may include at least one of helium, argon, and air (oxygen and nitrogen). Since the helium gas or the argon gas has a low discharge voltage, the discharge gas DG may desirably include the helium gas or the argon gas. A discharge gas supply line 204 for supplying the discharge gas DG to the tube 210 may be connected to the second end 214 of the tube 210, and the discharge gas supply line 204 may pass through the housing 100.

The high voltage electrode 220 may be disposed on the tube 210. The high voltage electrode 220 may be a ring-shaped electrode provided along an outer circumferential surface of the tube 210. The high voltage electrode 220 may be adjacent to one end 212 in the first direction D1 of the tube 210. The high voltage electrode 220 may include copper having a great conductivity, tungsten having an excellent conductivity and an excellent thermal resistance and rigidity, or other metallic materials. The high voltage electrode 220 may be electrically connected to an external power supply device 202 such as a direct current pulse or an alternating current high voltage power.

A ground electrode 230 may be disposed on the tube 210. The ground electrode 230 may be a ring-shaped electrode provided along the outer circumferential surface of the tube 210. The ground electrode 230 may be spaced apart from the high voltage electrode 220 in a direction opposite to the first direction D1. The ground electrode 230 may include copper having a great conductivity, tungsten having an excellent conductivity and an excellent thermal resistance and rigidity, or other metallic materials. According to a width of the ground electrode 230 in the first direction D1, an intensity of the plasma plume PP provided from the plasma source 200 may be adjusted. For example, as the width of the ground electrode 230 in the first direction D1 increases, although an intensity of plasma generated between the high voltage electrode 220 and the ground electrode 230 increases, an intensity of the plasma plume PP irradiated to a fatigue area may decrease. The ground electrode 230 may be electrically connected to the external power supply device 202 or a separate ground circuit. Unlike as illustrated, the ground electrode 230 may not be provided. In this case, the target (e.g., human skin) to which the plasma generation apparatus provides the plasma plume PP or surrounding air may be used as the ground electrode.

The discharge gas DG injected from the second end 214 of the tube 210 may move toward the ground electrode 230. The discharge gas DG may be electrically discharged between the high voltage electrode 220 and the ground electrode 230 to generate the plasma plume PP. The plasma plume PP may be transferred to the first end 212 of the tube 210 by the discharge gas DG that is continuously injected. The target to which the plasma plume PP is provided, e.g., a treatment portion to be treated, may be disposed on the first end 212 of the tube 210 (more particularly, one surface 102 of the housing 100 in the first direction D1). The treatment portion that is treated by the plasma plume PP may be a body surface.

Figure 4B:
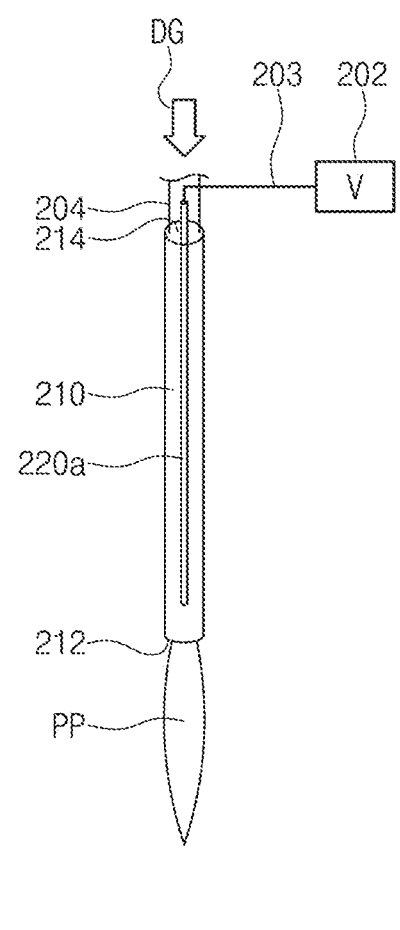

According to another embodiment, the high voltage electrode may be a core electrode 220a provided inside the tube 210. As illustrated in FIG. 4B, the core electrode 220a may have a rod or wire shape having a great ratio of a longitudinal length with respect to a transversal length. The core electrode 220a may extend in the first direction D1 in the tube 210. That is, the tube 210 may have a shape surrounding an outer portion of the core electrode 220a extending in the first direction D1. The core electrode 220a may have one end in the first direction D1, which protrudes below the first end 212 of the tube 210. The core electrode 220a may include a soft magnetic material. For example, the core electrode 220a may include a conductor such as silver, platinum, tungsten, or nickel.

Figure 4C:
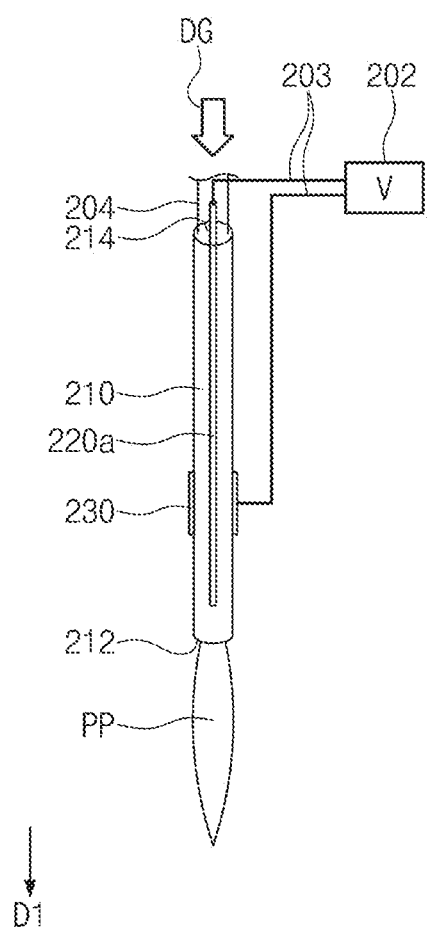

Although the ground electrode is not provided in FIG. 4B, the embodiment of the inventive concept is not limited thereto. As illustrated in FIG. 4C, a ground electrode 230 may be provided on the tube 210. The ground electrode 230 may have a ring shape provided along an outer circumferential surface of the tube. In this case, the ground electrode 230 may be spaced apart from one end in the first direction D1 of the core electrode 220a in a direction opposite to the first direction D1. That is, the ground electrode 230 may surround the core electrode 220a on an outer surface of the tube 210. The ground electrode 230 may be electrically connected to the external power supply device 202 or a separate electric circuit.

Figure 4D:
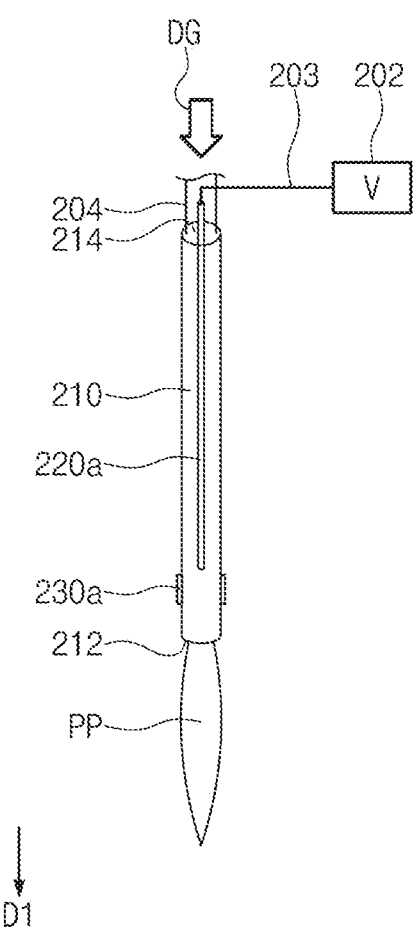

Alternatively, as illustrated in FIG. 4D, a ground electrode 230a may be provided on an outer circumferential surface of the tube 210. The ground electrode 230a may be spaced apart from one end in the first direction of the core electrode 220a in the first direction D1. That is, the ground electrode 230 may not surround the core electrode 200a on the outer surface of the tube 210. In this case, the ground electrode 230 may be a floating electrode that is not connected to the power supply device 202.

Figure 4E:
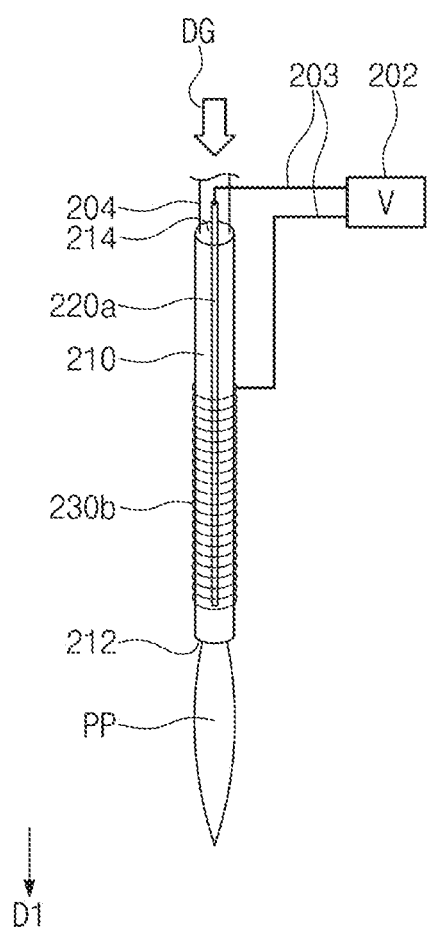

According to other embodiments, the ground electrode may be a spiral coil electrode. As illustrated in FIG. 4E, a spiral coil electrode 230b may be wound along the outer circumferential surface of the tube 210. The spiral coil electrode 230b may surround one end in the first direction D1 of the core electrode 220a on the outer circumferential surface of the tube 210. The spiral coil electrode 230b may include a conductive material such as copper. Although not shown, as necessary, an insulation layer may be provided between the spiral coil electrode 230b and the tube 210. That is, the spiral coil electrode 230b may have a shape directly winding a side surface of the insulation layer on the outer circumferential surface of the tube 210. The insulation layer may be a non-magnetic material containing an insulation material. The spiral coil electrode 230b may be electrically connected to the external power supply device 202 or a separate electric circuit.

Figure 4F:
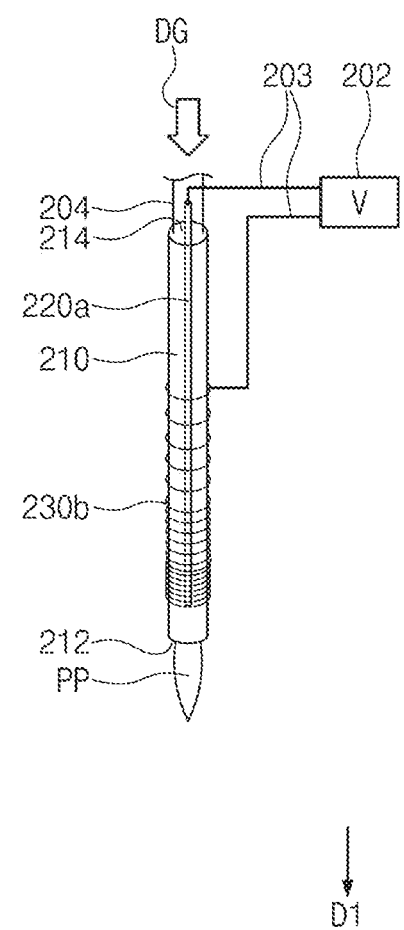
Figure 4G:
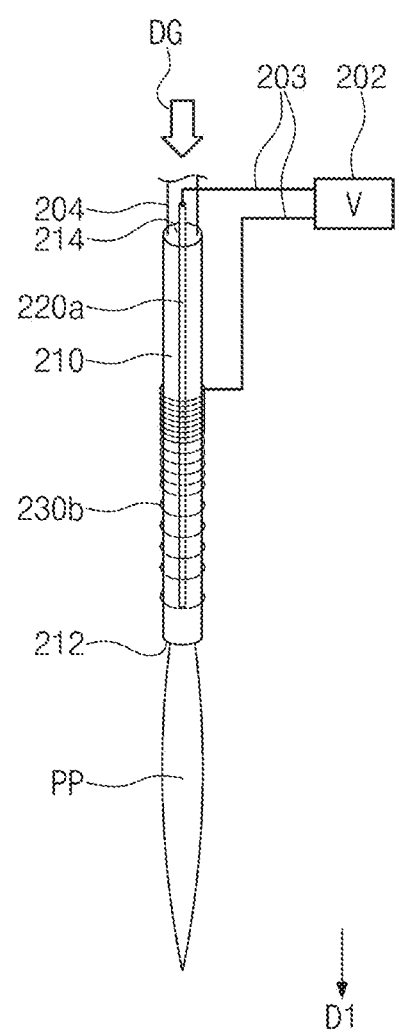

According to a size of an area on which the spiral coil electrode 230b is wound on the outer circumferential surface of the tube 210, the intensity of the plasma plume PP provided by the plasma source 200 may be adjusted. Here, the size of the area on which the spiral coil electrode 230b is wound may be proportional to a width in the first direction D1 of the spiral coil electrode 230b. For example, as illustrated in FIG. 4F, when an interval (here, an internal in the first direction D1) between coils of the spiral coil electrode 230b gradually decreases in the first direction D1, a length of the plasma plume PP may decrease further than when an interval between coils of the spiral coil electrode 230b is constant as in the embodiment in FIG. 4E. On the contrary, as illustrated in FIG. 4G, when an interval between coils of the spiral coil electrode 230b gradually increases in the first direction D1, a length of the plasma plume PP may increase further than when the interval between the coils of the spiral coil electrode 230b is constant as in the embodiment in FIG. 4E.

As described above, the plasma generation apparatus according to an embodiment of the inventive concept may adjust the intensity and length of the plasma plume PP as necessary.

According to an embodiment, the plasma generation apparatus may be a non-contact type plasma generation apparatus. Particularly, the plasma plume PP may be emitted by a length of several cm or more from the end 212 of the plasma source 200, and thus the plasma plume PP may be irradiated to a target without directly contacting the plasma generation apparatus to the target.

Also, although the target is not used as the ground electrode, the plasma generation apparatus itself may provide a large-area plasma plume by using an indirect type plasma forming method that forms the plasma plume by using electrodes in the plasma generation apparatus. That is, a non-contact type plasma generation apparatus providing a large-area plasma plume may be provided.

Referring to FIGS. 1 to 3 again, a power supply line 203 of the power supply device 202 supplying a power to the plasma source 200 may be installed in the housing 100. The power supply device 202 may be installed inside or outside the housing 100. When the power supply device 202 is installed outside the housing 100, the power supply line 203 may pass through the housing 100 and be connected to the plasma source 200.

Although the plasma source 200 having one plasma jet structure is installed in the housing in FIGS. 2 and 3, the embodiment of the inventive concept is not limited thereto. Unlike as illustrated in FIGS. 2 and 3, the plasma source 200 may have an array structure including a plurality of plasma jets. For example, the plasma source 200 may include a bundle of a plurality of plasma jets or a plurality of plasma jets arranged in parallel in the second direction D2. Alternatively, the plasma source 200 may include various arrangements of the plurality of plasma jets.

Figure 5:
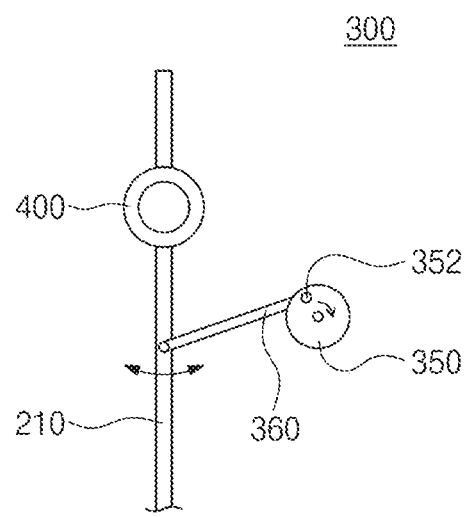
FIG. 5 is a cross-sectional view for explaining a driving unit.

The driving unit 300 and 400 may be disposed in the housing 100. The driving unit 300 and 400 may couple the plasma source 200 to the inside of the housing 100. Here, the plasma source 200 may be coupled to the inside of the housing 100 by the driving unit 300 and 400 in a movable manner (e.g., pendulum movement) Hereinafter, a constitution of the driving unit 300 and 400 will be described. FIG. 5 is a cross-sectional view for explaining the driving unit, particularly, a power transmission part of the driving unit.

Referring to FIGS. 2 and 5, the driving unit 300 and 400 may include a coupling unit 400 for coupling one end of the plasma source 200 to the inside of the housing 100 and a power transmission unit 300 spaced apart from the coupling unit 400 and transmitting a power to the plasma source 200.

The coupling unit 400 may be coupled to the plasma source 200. The coupling unit 400 may be disposed adjacent to one end in a direction opposite to the first direction D1 of the plasma source 200. For example, the coupling unit 400 may be directly coupled to the tube 210 so that the coupling unit 400 is adjacent to the second end 214 (refer to FIG. 4A) of the tube 210 (refer to FIG. 4A). Also, the coupling unit 400 may be coupled to the inside of the housing 100 in a rotatable manner. That is, the coupling unit 400 may rotate with respect to the housing 100, and the plasma source 200 may also rotate in conjunction with the coupling unit 400.

The power transmission unit 300 may be coupled to the plasma source 200. The power transmission unit 300 may be spaced apart from the coupling unit 400. For example, the power transmission unit 300 may be spaced apart from the coupling unit 400 in the first direction D1, and directly coupled to the tube 210 (refer to FIG. 4A). The power transmission unit 300 may transmit a power to the plasma source 200 so that a portion of the plasma source 200, which is coupled to the power transmission unit 300, performs a reciprocating movement in the second direction D2. Here, the reciprocating movement may include a reciprocating movement along a linear path and a reciprocating movement along a curved path. The plasma source 200 may perform a pendulum movement around an axis of the coupling unit 400 by power transmission of the power transmission unit 300. The wide plasma plume having a wide width may be provided by the pendulum movement of the plasma source 200 as described with reference to FIG. 3.

FIG. 5 is a view illustrating one embodiment of the power transmission unit for transmitting a power to the plasma source. As illustrated in detail in FIG. 5, the power transmission unit 300 may include a disc 350 spaced apart from the tube 210 in the second direction D2 and a shaft 360 connecting the disc 350 and the tube 210. The disc 350 may be coupled to the housing 100 (refer to FIG. 2) in a rotatable manner. The shaft 360 may have one end connected to the tube 210 and the other end connected to the disc 350. Here, a connection point 352 between the shaft 360 and the disc 350 may be spaced apart from a rotation center of the disc 350. The shaft 360 and the disc 350 may constitute a crank. For example, the shaft 360 may convert a rotation movement of the disc 350 into a reciprocating movement. That is, the shaft 360 may perform a reciprocating movement in the second direction D2 and the opposite direction to the second direction D2 according to rotation of the disc 350, and the shaft 360 may be coupled to the tube 210 to enable the tube 210 to perform a reciprocating movement. However, the embodiment of the inventive concept is not limited thereto. For example, the power transmission unit 300 according to embodiments of the inventive concept may include various devices for enabling the plasma source 200 to perform the reciprocating movement. For example, the power transmission unit may include a power gear and a frame moving along rotation of the power gear. The frame may perform a reciprocating movement according to the rotation of the power gear. Hereinafter, the power transmission unit in FIG. 5 will be continuously described.

According to an embodiment of the inventive concept, the movement of the plasma source 200 may be adjusted according to shapes of and coupling relationship between the power transmission unit 300 and the coupling unit 400. That is, the plasma generation apparatus according to an embodiment of the inventive concept may adjust a width of the plasma plume PP as necessary.

Although the embodiments of the power transmission unit 300 are described with reference to FIG. 5, the embodiment of the inventive concept is not limited thereto. The power transmission unit 300 according to an embodiment of the inventive concept may include various devices capable of transmitting a power to the plasma source 200 so that the plasma source 200 performs the reciprocating movement.

Referring to FIGS. 1 to 3 again, the power transmission unit 300 may be connected to a power supply device 302. The power supply device 302 may be installed inside or outside the housing 100. When the power supply device 302 is installed outside the housing 100, a power supply line 303 of the power supply device 302 may pass through the housing 100 and be connected to the power transmission unit 300.

According to another embodiment, the window 110 may be a variable window capable of adjusting a width of an opening in the second direction D2. For example, screens 112 may be disposed on one surface 102 in the first direction D1 of the housing 100. The screens 112 may partially cover the one surface 102 in the first direction D1 of the housing 100. The screens 112 may be spaced apart from each other in the second direction D2. Here, an area between the screens 112 may be defined as the window 110. The screens 112 may be adjacent to each other or spaced apart from each other, and thus a width in the second direction D2 of the window 110 may be adjusted. According to the width of the window 110, a width of the plasma plume PP passing through the window 110 and emitted to the outside of the housing 100 may be adjusted. That is, the plasma generation apparatus according to an embodiment of the inventive concept may easily provide the plasma plume PP having a width that is required by a user.

Although not shown, the plasma generation apparatus may further include a pressure regulating device, a flow speed regulating device, and a ventilator. The plasma plume PP may have a transmission speed that is regulated by the pressure regulating device (not shown) and the flow speed regulating device (not shown). Also, circulation of an injected discharge gas and an exhausted gas (plasma plume and remained gas that is not reacted) may be adjusted by the ventilator (not shown).

Figure 6:
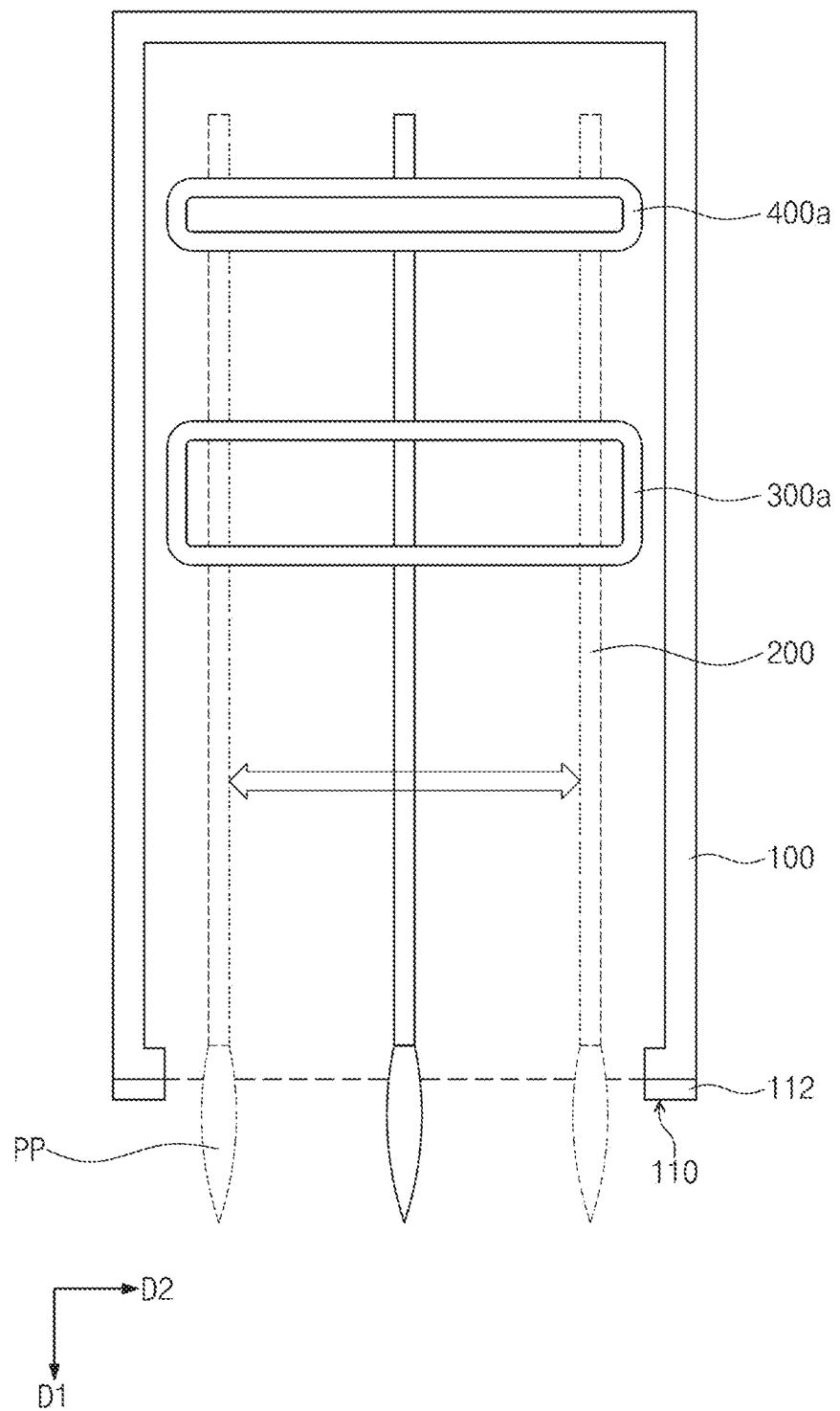
FIG. 6 is a cross-sectional view for explaining a plasma generation apparatus and an operation thereof according to the embodiments of the inventive concept.

FIG. 6 is a cross-sectional view for explaining a plasma generation apparatus according to embodiments of the inventive concept. In embodiments below, components described in the embodiments of FIGS. 1 to 3 will be designated by the same reference numerals, and descriptions thereof will be omitted or simply described for convenience of description. That is, different points between the embodiments of FIGS. 1 to 3 and embodiments below will be mainly described.

Referring to FIGS. 1 and 6, the housing 100 may be provided. The plasma source 200 may be disposed inside the housing 100.

The plasma source 200 may be coupled to the housing 100 so that the plasma source 200 is movable in the housing 100. For example, as illustrated in FIG. 6, the plasma source 200 may perform a linear reciprocating movement in the housing. Here, a movement direction of the plasma source 200 may include the second direction D2 and the opposite direction to the second direction D2. As the plasma source 200 performs the linear reciprocating movement, the plasma plume PP, which is provided and emitted from the plasma source 200, may also perform a reciprocating movement in the second direction D2. The plasma generation apparatus according to an embodiment of the inventive concept may provide the plasma plume PP having a wide width by using a simple structure.

The plasma source 200 may be coupled to the inside of the housing 100 by driving unit 300a and 400a so as to perform a movement (e.g., pendulum movement). The driving unit 300a and 400a may include a coupling unit 400a for coupling one end of the plasma source 200 to the inside of the housing 100 and a power transmission unit 300a spaced apart from the coupling unit 400a and transmitting a power to the plasma source 200.

The coupling unit 400a may be coupled to the plasma source 200. The coupling unit 400a may be disposed adjacent to one end in a direction opposite to the first direction D1 of the plasma source 200. For example, the coupling unit 400a may be directly coupled to the tube 210 so that the coupling unit 400a is adjacent to the second end 214 (refer to FIG. 4A) of the tube 210 (refer to FIG. 4A). Also, the coupling unit 400a may be coupled to be movable in the second direction D2 and the opposite direction to the second direction D2 in the housing 100. That is, the coupling unit 400a may be linearly move with respect to the housing 100, and the plasma source 200 also may move in the second direction D2 and the opposite direction to the second direction D2 in conjunction with the coupling unit 400a.

The power transmission unit 300a may be coupled to the plasma source 200. The power transmission unit 300a may be spaced apart from the coupling unit 400a. For example, the power transmission unit 300a may be spaced apart from the coupling unit 400a in the first direction D1, and directly coupled to the plasma source 200. The power transmission unit 300a may transmit a power to the plasma source 200 so that a portion of the plasma source 200, which is coupled to the power transmission unit 300, performs a reciprocating movement in the second direction D2. Here, the reciprocating movement may include a reciprocating movement along a linear path. The plasma source 200 may perform a linear reciprocating movement in the second direction D2 and the opposite direction to the second direction D2 by the power transmission of the power transmission unit 300a. The wide plasma plume PP having a wide width may be provided by the reciprocating movement of the plasma source 200.

In the embodiment of FIG. 6, the power transmission unit 300a may be substantially the same or similar to that described with reference to FIG. 5. For example, as illustrated in FIG. 5C, the power transmission unit 300a may include a disc 350 spaced apart from the tube 210 in the second direction D2 and a shaft 360 connecting the disc 350 and the tube 210. Also, the power transmission unit 300a may include a first power gear and a first frame moving along rotation of the first power gear. Here, the first frame may have a rectangular ring shape in the second direction D2, and each of an upper gear and a lower gear may linearly extend in the second direction D2. Alternatively, the power transmission unit 300a may include a second power gear having a triangular shape and a second frame.

The plasma source 200 may perform a linear reciprocating movement in the second direction D2 and the opposite direction to the second direction D2, and the wide plasma plume may be provided by the above-described power transmission unit 300a.

Since the plasma source is able to scan a predetermined area of the target through a reciprocating movement, the plasma generation apparatus according to the embodiments of the inventive concept may provide a large-area plasma plume and increase uniformity of the provided plasma plume through the simple structure. Furthermore, the plasma generation apparatus may easily provide the plasma plume having a width, a length, and an intensity, which are requested by the user.

Also, since the plasma source does not continuously provide the plasma plume to one area, the plasma generation apparatus according to the embodiments of the inventive concept may not transmit excessive thermal energy to the target, the stability related to the temperature of the plasma generation apparatus may improve, and the risk of electric shock may be relieved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. A plasma generation apparatus comprising:
a housing in which a window is defined at one side in a first direction;
a stick type plasma source provided in the housing to generate a plasma toward the window; and
a driving unit coupled to the plasma source to allow one end of the plasma source to perform a reciprocating movement in a second direction that is a longitudinal direction of the window.

2. The plasma generation apparatus of claim 1, wherein the plasma source has a structure comprising one plasma jet or an array structure comprising a plurality of plasma jets.

3. The plasma generation apparatus of claim 1, wherein the driving unit comprises:
a coupling unit configured to couple other end of the plasma source to the inside of the housing; and
a power transmission unit spaced apart from the coupling unit to transmit a power to the plasma source.

4. The plasma generation apparatus of claim 3, wherein the power transmission unit comprises:
a disc spaced by a predetermined distance from the plasma source in a rotatable manner; and
a shaft configured to convert a rotation movement of the disc into a reciprocating movement and transmit the converted reciprocating movement to the plasma source.

5. The plasma generation apparatus of claim 3, wherein the coupling unit couples an axis of rotation of the plasma source to the inside of the housing,
the plasma source performs a pendulum movement by the driving unit, and
the one end of the plasma source emits the plasma toward the window.

6. The plasma generation apparatus of claim 3, wherein the coupling unit couples the plasma source to the inside of the housing so that the plasma source moves in the second direction,
the plasma source performs a linear reciprocating movement in the second direction by the driving unit, and
the one end of the plasma source emits the plasma toward the window.

7. The plasma generation apparatus of claim 1, wherein the plasma source comprises:
a tube which extends in the first direction and in which the plasma source is provided; and
an electrode disposed adjacent to the one end of the plasma source on an outer circumferential surface of the tube.

8. The plasma generation apparatus of claim 7, wherein the electrode comprises a ring electrode or a spiral coil electrode, which surrounds the tube.

9. The plasma generation apparatus of claim 7, wherein the plasma source further comprises a core electrode disposed in the tube and extending in the first direction.

10. The plasma generation apparatus of claim 1, wherein the window is a variable window in which a width of an opening is adjusted in the second direction.

* * * * *